(12) United States Patent
Zheng et al.

(10) Patent No.: US 12,132,299 B2
(45) Date of Patent: Oct. 29, 2024

(54) POWER CABINET

(71) Applicant: Sungrow Power Supply Co., Ltd., Hefei (CN)

(72) Inventors: Hao Zheng, Hefei (CN); Qiyao Zhu, Hefei (CN); Longlin Sun, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 12 days.

(21) Appl. No.: 17/665,340

(22) Filed: Feb. 4, 2022

(65) Prior Publication Data

US 2022/0271515 A1    Aug. 25, 2022

(30) Foreign Application Priority Data

Feb. 19, 2021   (CN) .......................... 202110189215.2

(51) Int. Cl.
*H02B 1/56* (2006.01)
*H02B 1/28* (2006.01)
*H02B 1/30* (2006.01)
*H02S 40/38* (2014.01)

(52) U.S. Cl.
CPC ............... *H02B 1/565* (2013.01); *H02B 1/28* (2013.01); *H02B 1/306* (2013.01); *H02S 40/38* (2014.12)

(58) Field of Classification Search
CPC .......... H02B 1/28; H02B 1/306; H02B 1/565; H02S 40/38
See application file for complete search history.

(56) References Cited

U.S. PATENT DOCUMENTS

| 9,974,214 | B2 * | 5/2018 | Hamari ................. H05K 7/206 |
| 10,212,861 | B2 | 2/2019 | Ashbaugh et al. |
| 10,462,938 | B2 * | 10/2019 | Wan .................... H05K 7/20181 |
| 11,165,367 | B2 * | 11/2021 | Chen ...................... H02M 1/14 |
| 2018/0352685 | A1 | 12/2018 | Wan et al. |
| 2020/0375063 | A1 | 11/2020 | Reichenbach et al. |
| 2021/0391824 | A1 | 12/2021 | Zheng et al. |

(Continued)

FOREIGN PATENT DOCUMENTS

| CN | 202374619 U | 8/2012 |
| CN | 103259421 A | 8/2013 |

(Continued)

OTHER PUBLICATIONS

Second Office Action for Chinese Application No. 202110189215.2, dated Nov. 23, 2022.

(Continued)

*Primary Examiner* — Robert J Hoffberg
(74) *Attorney, Agent, or Firm* — Wolf, Greenfield & Sacks, P.C.

(57) ABSTRACT

A power cabinet, which includes a cabinet body and an electric reactor, a power unit and a switch arranged in the interior of the cabinet body. In the interior of the cabinet body of the power cabinet, the electric reactor is arranged close to a first side in the interior of the cabinet body, and the power unit and the switch are arranged on a second side in the interior of the cabinet body, opposite to the first side. Moreover, these electric reactor, the power unit and the switch are all located in a lower space. In addition, in the power cabinet, the electric reactor and power unit dissipate heat in different chambers from the switch dissipates heat.

16 Claims, 13 Drawing Sheets

(56) References Cited

U.S. PATENT DOCUMENTS

| | | | | |
|---|---|---|---|---|
| 2022/0271710 A1* | 8/2022 | Zheng | ................ | H05K 7/20918 |
| 2022/0272876 A1* | 8/2022 | Zheng | ................... | H02M 7/003 |
| 2023/0268842 A1* | 8/2023 | Zheng | ................ | H05K 7/20909 |
| | | | | 361/695 |

FOREIGN PATENT DOCUMENTS

| | | | | |
|---|---|---|---|---|
| CN | 203675519 U | | 6/2014 | |
| CN | 203951356 U | * | 11/2014 | |
| CN | 204349814 U | * | 5/2015 | ............ Y20E 10/56 |
| CN | 205104906 U | | 3/2016 | |
| CN | 105682430 A | | 6/2016 | |
| CN | 106300901 A | | 1/2017 | |
| CN | 107171570 A | | 9/2017 | |
| CN | 206628971 U | | 11/2017 | |
| CN | 107732714 A | | 2/2018 | |
| CN | 207184063 U | | 4/2018 | |
| CN | 111587051 A | | 8/2020 | |
| CN | 111865050 A | | 10/2020 | |
| CN | 112236018 A | | 1/2021 | |
| EP | 0 794 098 A1 | | 9/1997 | |
| WO | WO-2016197791 A1 | * | 12/2016 | ............... H02B 1/30 |

OTHER PUBLICATIONS

First Office Action for Chinese Application No. 202110189215.2, dated Apr. 13, 2022.

Extended European Search Report for European Application No. 22155858.8, dated Jul. 15, 2022.

\* cited by examiner

POWER CABINET

CROSS REFERENCE TO RELATED DISCLOSURES

The present disclosure claims the priority to Chinese Patent Disclosure No. 202110189215.2 titled "POWER CABINET", filed with the China National Intellectual Property Administration on Feb. 19, 2021, which is incorporated herein by reference in its entirety.

FIELD

The present disclosure relates to the field of power electronics, and in particular to a power cabinet.

BACKGROUND

At present, with the gradually realization of getting the power on the grid from large-scale photovoltaic power plants in fair price, a photovoltaic grid-connected inverter, as an interface equipment between a solar power system and the grid, is facing increasingly strong power requirements, this is because that the higher power means the lower cost per watt, and the photovoltaic grid-connected inverter plays a significant role on getting the power on the grid in fair price.

FIG. 1 shows a container-type power cabinet, which has a higher cost, thereby worsening the increasingly severe cost pressure; and FIG. 2 shows an outdoor box-type inverter power cabinet with a more complicated overall structure and layout. When the power level needs to be further upgraded, two, three or more inverters are needed to be integrated together, thereby increasing the overall floor space and assembly and maintenance space, that is, the overall cost of the outdoor box-type inverter power cabinet is increased.

SUMMARY

In view of this, a power cabinet is provided according to the present disclosure, so as to reduce the overall cost of the power cabinet.

In order to achieve the above objects, the following technical solutions are provided according to the present disclosure.

A power cabinet is provided according to the present disclosure, which includes a cabinet body and an electric reactor, a power unit and a switch arranged in the interior of the cabinet body; where the electric reactor is arranged in a lower space close to a first side in the interior of the cabinet body;
the power unit and the switch are arranged in a lower space of a second side in the interior of the cabinet body, and the first side is opposite to the second side;
the power unit, the electric reactor and the switch are electrically connected in sequence.

In an embodiment, the electric reactor is arranged in a lower space between the first side and the second side.

In an embodiment, the power cabinet further includes a DC power distribution unit, which is arranged on the first side in the interior of the cabinet body;
the DC power distribution unit, the power unit, the electric reactor, and the switch are electrically connected in sequence;
an input end of the DC power distribution unit is served as a DC port of the power cabinet and is led out from a lower portion of the first side;
an output end of the switch is served as an AC port of the power cabinet and is led out from a lower portion of the second side.

In an embodiment, the power cabinet further includes a control unit, which is arranged in an upper space of the second side;
the control unit is electrically connected with the DC power distribution unit, the power unit, and the switch, respectively.

In an embodiment, the DC power distribution unit includes a DC fuse component and a DC switch;
a DC side of the power unit is connected to the DC fuse component via the DC switch;
the DC switch is arranged in an upper space of the first side;
the DC fuse component is arranged in a lower space of the first side.

In an embodiment, the power unit is close to one side edge between the first side and the second side;
the electric reactor is arranged at the center between two side edges and arranged between the first side and the second side, and the DC power distribution unit and the switch are close to the other side edge between the first side and the second side; or the DC power distribution unit is arranged at the center between two side edges and arranged between the first side and the second side, and the electric reactor and the switch are close to the other side edge between the first side and the second side.

In an embodiment, the power unit and the electric reactor are arranged in sequence along one side edge between the first side and the second side, and the switch and the DC power distribution unit are arranged in sequence along the other side edge between the first side and the second side.

In an embodiment, the power unit and the DC power distribution unit are close to a side edge between the first side and the second side;
the electric reactor is arranged at the center between two side edges and arranged between the first side and the second side;
the switch is close to the other side edge between the first side and the second side.

In an embodiment, a device with the heat dissipating capacity exceeding a heating threshold is arranged in a first chamber inside the cabinet body, and
a device with a protection requirement level exceeding a preset protection level is arranged in a second chamber inside the cabinet body.

In an embodiment, the power unit and the electric reactor are arranged in the first chamber;
the switch is arranged in the second chamber.

In an embodiment, in a case that the power cabinet includes the DC power distribution unit, the DC power distribution unit is arranged in the second chamber;
in a case that the power cabinet includes the control unit, the control unit is arranged in the second chamber.

In an embodiment, the power cabinet further includes a heat dissipator; where the power unit is arranged on the heat dissipator, and the heat dissipator is arranged in the lower space of the second side in the interior of the cabinet body and located in the same chamber with the power unit.

In an embodiment, a main heat-dissipation channel for dissipating heat to the corresponding devices is arranged in the first chamber in the interior of the cabinet body;
a secondary heat-dissipation channel for dissipating heat to corresponding devices is arranged in the second chamber.

In an embodiment, the main heat-dissipation channel is a direct air-cooled heat-dissipation channel;

the secondary heat-dissipation channel is a direct air-cooled heat-dissipation channel or a heat exchanging air-cooled heat-dissipation channel.

In an embodiment, in a case that the power unit and the electric reactor are arranged on different side edges between the first side and the second side, the main heat-dissipation channel includes a first sub-heat-dissipation channel and a second sub-heat-dissipation channel, where the first sub-heat-dissipation channel is configured to dissipate heat for the power unit; the second sub-heat-dissipation channel is located below the switch and is configured to dissipate heat for the electric reactor;

an inlet of the first sub-heat-dissipation channel and an inlet of the second sub-heat-dissipation channel are separately arranged.

In an embodiment, in a case that the first sub-heat-dissipation channel and the second sub-heat-dissipation channel are in communication with each other, the first sub-heat-dissipation channel and the second sub-heat-dissipation channel share one single outlet;

in a case that the first heat-dissipation sub-channel and the second heat-dissipation sub-channel are separated from each other, an outlet of the first heat-dissipation sub-channel and an outlet of the second heat-dissipation sub-channel are separately arranged.

In an embodiment, in a case that the power unit and the electric reactor are arranged on the same side edge between the first side and the second side, the main heat-dissipation channel is an integrated straight-through heat-dissipation channel.

In an embodiment, the main heat-dissipation channel is divided into at least two sections being mutually communicated, and each device is arranged in the corresponding section, respectively.

In an embodiment, in a case that the main heat-dissipation channel is a direct air-cooled heat-dissipation channel, an air blower chamber is arranged at the inlet of the main heat-dissipation channel, and the air blower chamber includes at least one sub-air blower chamber; where in a case that the main heat-dissipation channel includes at least two sub-heat-dissipation channels, each of sub-heat-dissipation channels corresponds to one sub-air blower chamber;

a corresponding air blower is arranged in the sub-air blower chamber.

In an embodiment, the air blower chamber is arranged outside the inlet of the main heat-dissipation channel.

In an embodiment, in a case that the main heat-dissipation channel is arranged in a horizontal direction, the first side and the second side are a front portion and a rear portion, respectively;

the inlet of the main heat-dissipation channel is arranged at a front portion of the cabinet body or a front portion of any side surface, and the outlet of the main heat-dissipation channel is arranged at a rear portion of the cabinet body or a rear portion of any side surface; or the inlet of the main heat-dissipation channel is arranged at the rear portion of the cabinet body or the rear portion of any side surface, and the outlet of the main heat-dissipation channel is arranged at the front portion of the cabinet body or the front portion of any side surface.

In an embodiment, the secondary heat-dissipation channel includes a heat exchanger, an external circulation air duct inlet, and an external circulation air duct outlet; where the heat exchanger is arranged at the top or bottom of the cabinet body and includes an external circulation air blower and an internal circulation air blower;

the external circulation air duct inlet and the external circulation air duct outlet are both in communication with the external circulation air duct provided by the external circulation air blower;

the DC power distribution unit, the switch and the control unit are all located in the internal circulation air duct provided by the internal circulation air blower.

In an embodiment, the secondary heat-dissipation channel further includes at least one circulation turbulence device arranged in the internal circulation air channel.

In an embodiment, protection structures are arranged outside the inlet and the outlet of the main heat-dissipation channel and outside the inlet and the outlet of the secondary heat-dissipation channel.

In an embodiment, the protection structure includes a waterproof louver structure and/or a dustproof wire-mesh structure.

It can be seen from the above technical solutions that the present disclosure provides a power cabinet, which includes a cabinet body and an electric reactor, a power unit and a switch arranged in the interior of the cabinet body. In the interior of the cabinet body of the power cabinet, the electric reactor is arranged close to a first side in the interior of the cabinet body, and the power unit and the switch are arranged on a second side opposite to the first side in the interior of the cabinet body, where these electric reactor, the power unit and the switch are all located in a lower space, and thus the connection paths between these electric reactor, the power unit and the switch are reduced, so that the connection cost and the overall volume of the power cabinet are decreased, and the overall cost of the power cabinet is reduced. In addition, in the power cabinet, the electric reactor and the power unit dissipate heat in different chambers from the switch, so that the overall heat-dissipation efficiency of the power cabinet is improved, thereby reducing the heat-dissipation cost of the power cabinet.

BRIEF DESCRIPTION OF THE DRAWINGS

For more clearly illustrating embodiments of the present disclosure or technical solutions in the conventional technology, the drawing referred to describe the embodiments or the conventional technology will be briefly described hereinafter. Apparently, the drawings in the following description are only some examples of the present disclosure, and for those skilled in the art, other drawings may be obtained based on the provided drawing without any creative efforts.

FIG. 9 is another schematic cross-sectional view along line A-A shown in FIG. 3c and FIG. 6a.

DETAILED DESCRIPTION OF THE EMBODIMENTS

Figure 1:
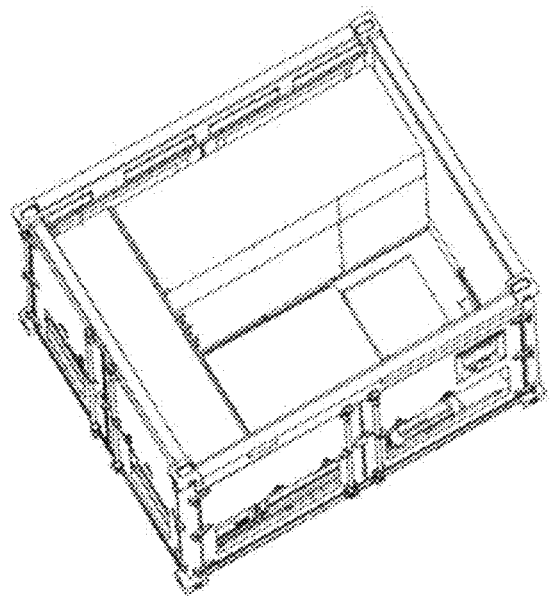
FIG. 1 is a schematic structural view of a container-type power cabinet in the prior art.
Figure 2:
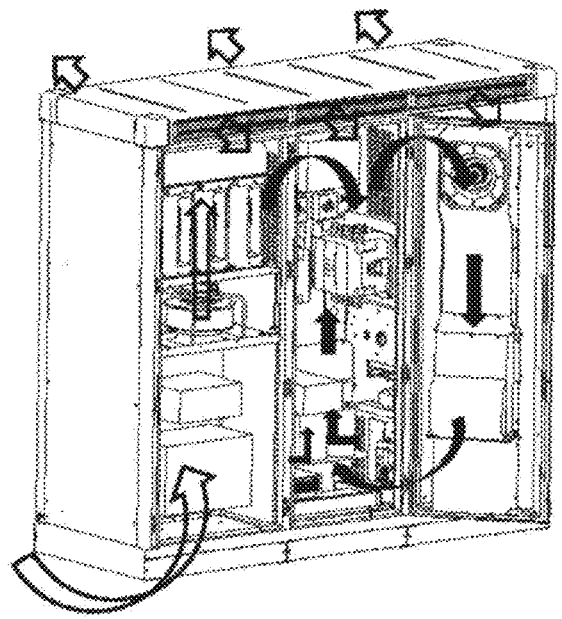
FIG. 2 is a schematic structural view of an inverter power cabinet in the prior art.
Figure 3A:
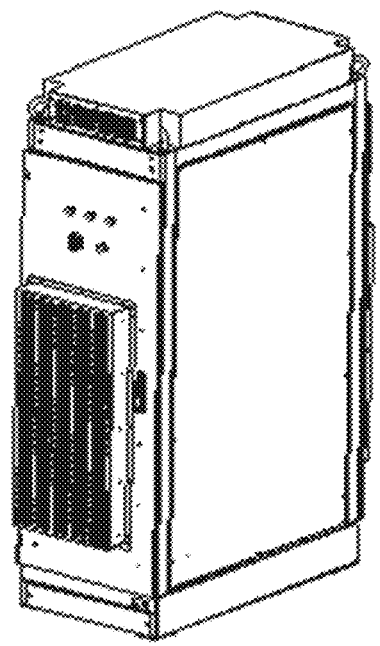
FIG. 3a is a schematic axonometrical view of a power cabinet provided according to an embodiment of the present disclosure.
Figure 3B:
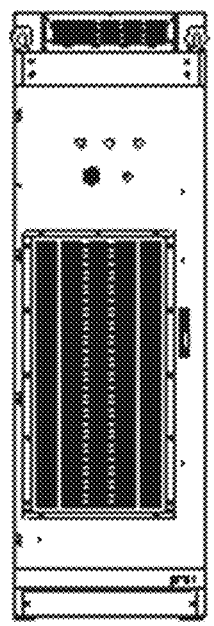
FIGS. 3b, 3c, and 3d are respectively a front view, a side view, and a rear view of a power cabinet provided according to an embodiment of the present disclosure.
Figure 3C:
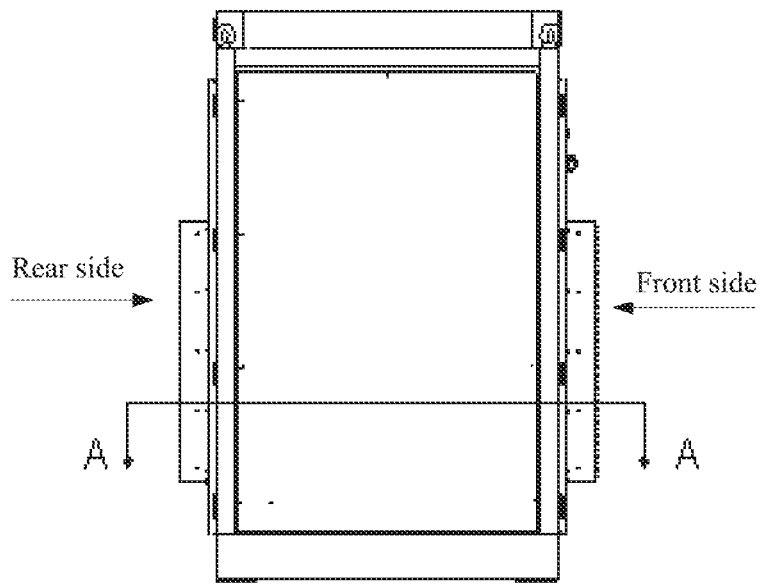
Figure 3D:
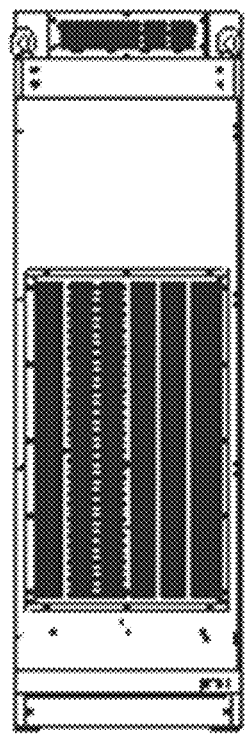

Technical solutions of embodiments of the present disclosure will be clearly and completely described hereinafter in conjunction with the drawings of the embodiments according to the present disclosure. Apparently, the embodiments described are only some embodiments of the present disclosure, rather than all embodiments. Any other embodiments obtained by those skilled in the art and based on the embodiments of the present disclosure without any creative work will fall within the protection scope of the present disclosure.

The relation terms such as "first", "second" and the like herein are only used herein to distinguish one entity or operation from another, rather than to necessitate or imply existence of an actual relation or order between the entities or operations. Furthermore, terms "include", "comprise" or any other variants thereof are intended to be non-exclusive. Therefore, a process, method, article or device including a series of elements includes not only the elements but also other elements that are not enumerated or other elements inherent to such process, method, article or device. Unless expressively limited otherwise, a process, method, article or device limited by "comprising/including a (n) . . . " does not exclude existence of another identical element in the process, method, article or device.

In order to reduce the own overall cost, a power cabinet is provided according to an embodiment of the present disclosure, the appearance of which is shown in FIG. 3a to FIG. 3d, and reference of the specific structure can be made to FIG. 4a, FIG. 4b, FIG. 5a, FIG. 5b, FIG. 6a and FIG. 6b. The power cabinet specifically includes a cabinet body 40 and an electric reactor 02, a power unit 01 and a switch 03 arranged in the interior of the cabinet body 40.

In the power cabinet, the electric reactor 02 is arranged in a lower space close to a first side in the interior of the cabinet body 40, and the power unit 01 and the switch 03 are arranged in a lower space of a second side in the interior of the cabinet body 40. Also, the power unit 01, the electric reactor 02 and the switch 03 are electrically connected in sequence, where, the first and second sides of the interior of cabinet body 40 are two opposite sides of the interior of cabinet body 40.

It should be noted that in a case that the output of the power cabinet is alternating current, the switch 03 is an alternating current switch. In practical application, other circumstances are not excluded, and no specific limitation is made here.

Since the power unit 01, the switch 03, and the electric reactor 02 are all located in the lower space, the connection paths between these three are reduced, so that the connection cost and the overall volume of the power cabinet are reduced, and the overall cost of the power cabinet is reduced.

Optionally, the electric reactor 02 is arranged in a lower space between the first side and the second side in the interior of the cabinet body 40. In practical application, other implementation modes are not excluded, and no specific limitation is made here and may be determined according to the specific circumstances, and all of the implementation modes are within the protection scope of the present disclosure.

Figure 4A:
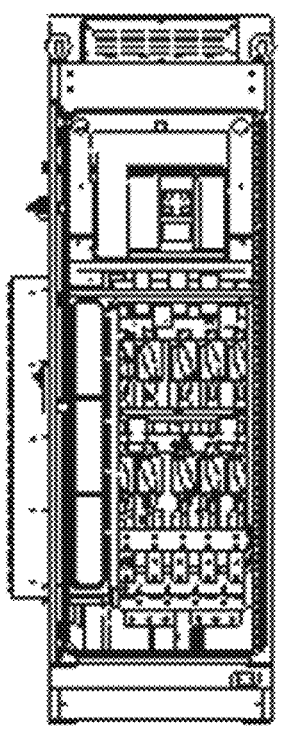
FIGS. 4a and 4b are a rear view of the inside of a cabinet body 40 and a schematic equivalent view of devices provided according to an embodiment of the present disclosure, respectively.
Figure 4B:
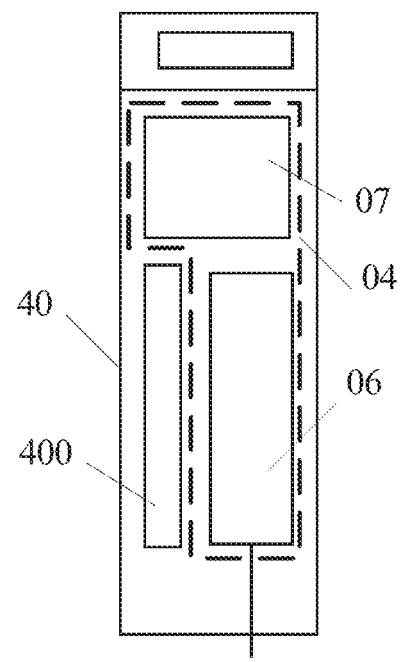
Figure 5A:
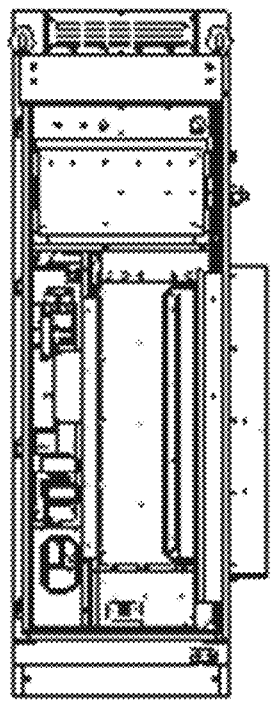
FIGS. 5a and 5b are a schematic front view of the inside of a cabinet body 40 and a schematic equivalent view of devices provided according to an embodiment of the present disclosure, respectively.
Figure 5B:
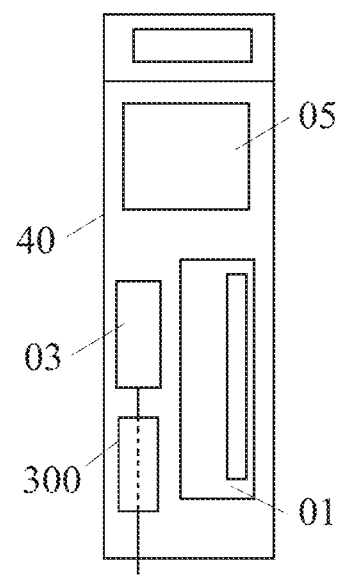
Figure 6A:
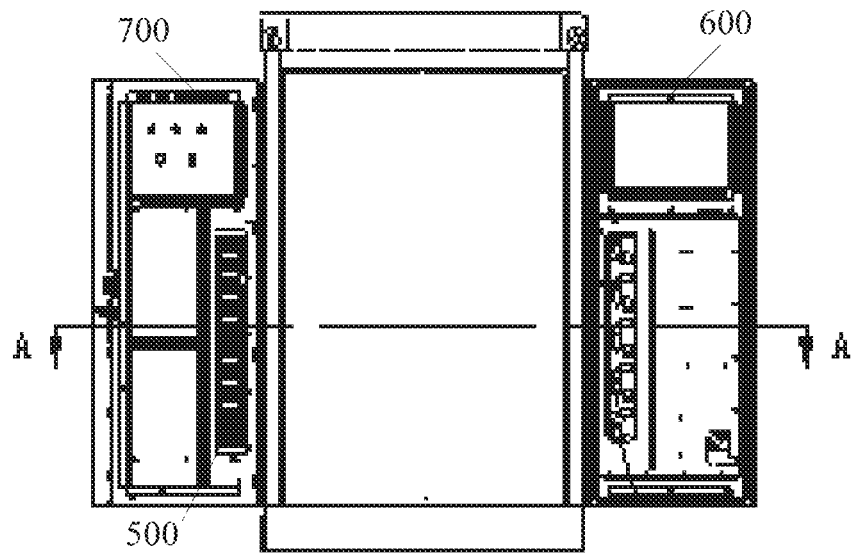
FIGS. 6a and 6b are a schematic side view of the inside of a cabinet body 40 and a schematic equivalent view of devices provided according to an embodiment of the present disclosure, respectively.
Figure 6B:
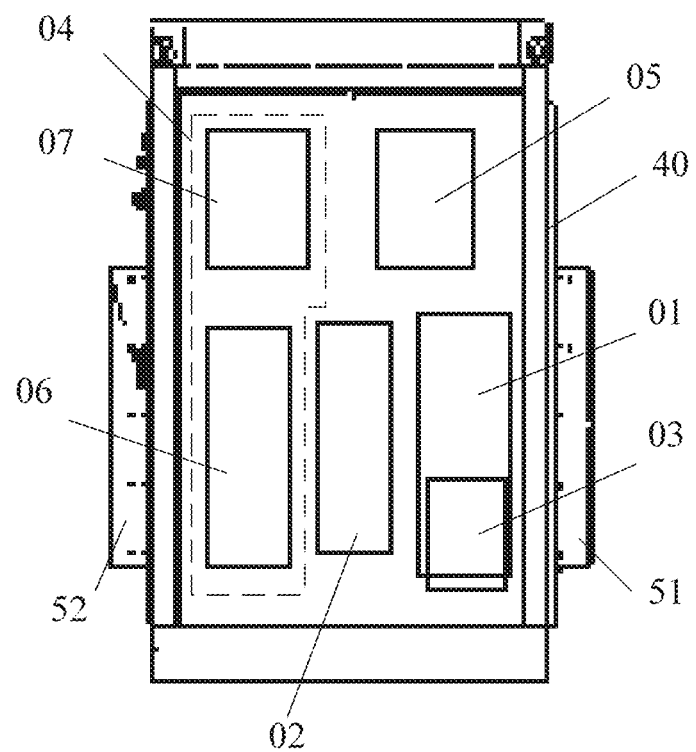

Further, as shown in FIGS. 6a and 6b, the power cabinet further includes a DC power distribution unit 04 and a control unit 05; where the DC power distribution unit 04 is arranged on the first side in the interior of the cabinet body 40 as shown in FIGS. 4a and 4b, and the control unit 05 is arranged in an upper space of the second side in the interior of the cabinet body 40, as shown in FIGS. 5a and 5b.

Also, in the power cabinet, the DC power distribution unit 04, the power unit 01, the electric reactor 02, and the switch 03 are electrically connected in sequence, and the control unit 05 is electrically connected to the DC power distribution unit 04, the power unit 01, and the switch 03, respectively. As shown in FIG. 4b, an input end of the DC power distribution unit 04 is served as the input of the power cabinet and is led out from the lower portion of the first side in the interior of the cabinet body 40. As shown in FIG. 5b, an output end of the switch 03 is served as the output of the power cabinet and is led out from the lower portion of the second side in the interior of the cabinet body 40.

It should be noted that each of devices is dispersedly arranged in different spaces of the interior of the cabinet body 40, and the internal space of the cabinet body 40 can be further effectively utilized. Also, as shown in FIG. 6b, positions of each device located in the interior of the cabinet body 40 are corresponding to the connection relations between them, so that the previous connection paths of each device can be reduced, and the overall cost of the power cabinet can be further reduced.

In addition, it should be further noted that the power cabinet further includes a heat dissipator. However, since the power unit 01 is arranged on the heat dissipator, the position of the heat dissipator is based on the power unit 01, which is not shown in the Figures. The heat dissipator is also arranged in the lower space of the second side in the interior of the cabinet body 40 and is in the same chamber with the electric reactor.

Specifically, as shown in FIGS. 4a, 4b, 6a, and 6b, the DC power distribution unit 04 includes a DC fuse component 06 and a DC switch 07.

Herein, the DC switch 07 is arranged in the upper space of the first side in the interior of the cabinet body 40, the DC fuse component 06 is arranged in the lower space of the first side in the interior of the cabinet body 40. Also, a lower end of the DC fuse component 06 is served as an input end of the DC power distribution unit 04, and an upper end of the DC fuse component 06 is connected to a DC side of the power unit 01 by the DC switch 07.

On the basis of the above embodiment, this embodiment provides several exemplary descriptions to the relative positions between the devices, where:

The first arrangement mode for the relative positions between the devices is specifically as follows.

The power unit 01 is close to one side edge between the first side and the second side; the electric reactor 02 is arranged in the center between two side edges and between the first side and the second side, and the DC power distribution unit 04 and the switch 03 are close to the other side edge between the first side and the second side.

Figure 7A:
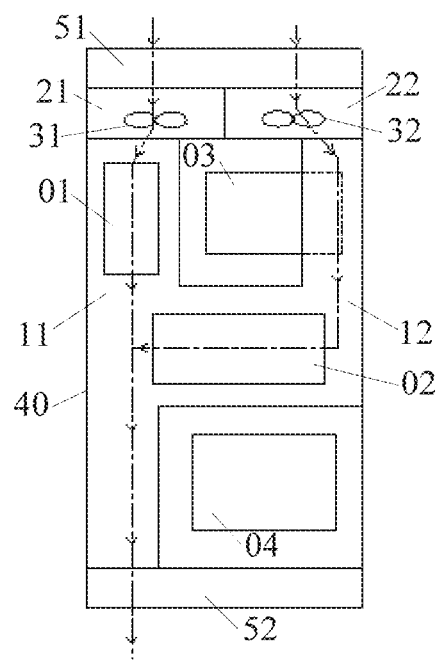
FIGS. 7a, 7c, 7e and 7g are four schematic cross-sectional views along line A-A shown in FIG. 3c and FIG. 6a, respectively.
Figure 7B:
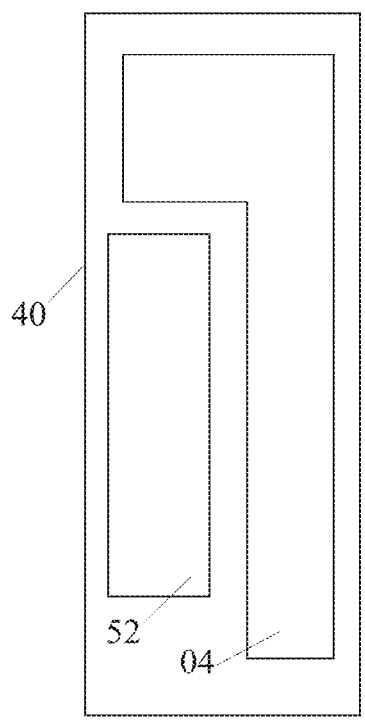
FIGS. 7b, 7d, 7f and 7h are four schematic side views of a power cabinet provided according to an embodiment of the present disclosure, respectively.

For example, as shown in FIGS. 7a and 7b, the power unit 01 is close to the left side edge between the first side and the second side, the electric reactor 02 is arranged in the center between the left side edge and the right side edge, and the DC power distribution unit 04 and the switch 03 are close to the right side edge between the first side and the second side.

The second arrangement mode for the relative positions between the devices is specifically as follows.

The power unit 01 is close to one side edge between the first side and the second side; the DC power distribution unit 04 is located in the center between two side edges and between the first side and the second side, and the electric reactor 02 and the switch 03 are close to the other side edge between the first side and the second side.

Figure 7C:
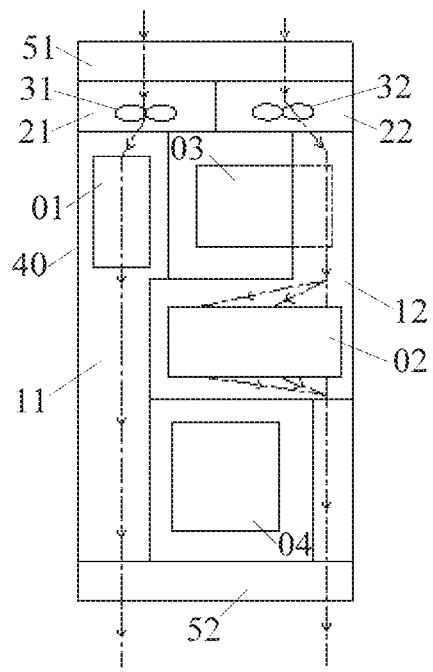
Figure 7D:
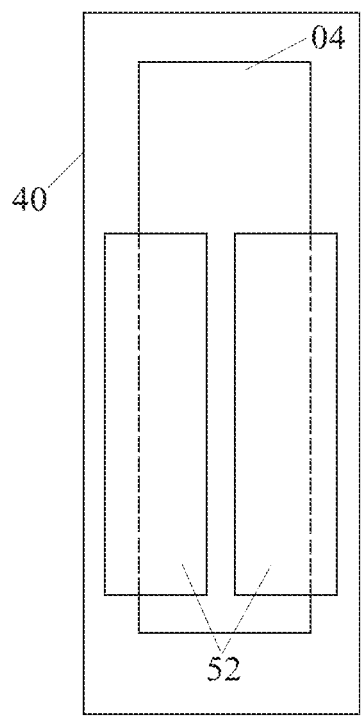

For example, as shown in FIG. 7c and FIG. 7d, the power unit 01 is close to the left side edge between the first side and the second side, the DC power distribution unit 04 is arranged in the center between the left side edge and the right side edge, and the electric reactor 02 and the switch 03 are close to the right side edge between the first side and the second side.

The third arrangement mode for the relative positions between the devices is specifically as follows.

The power unit 01 and the electric reactor 02 are arranged in sequence along one side edge between the first side and the second side, and the switch 03 and the DC power distribution unit 04 are arranged in sequence along the other side edge between the first side and the second side.

Figure 7E:
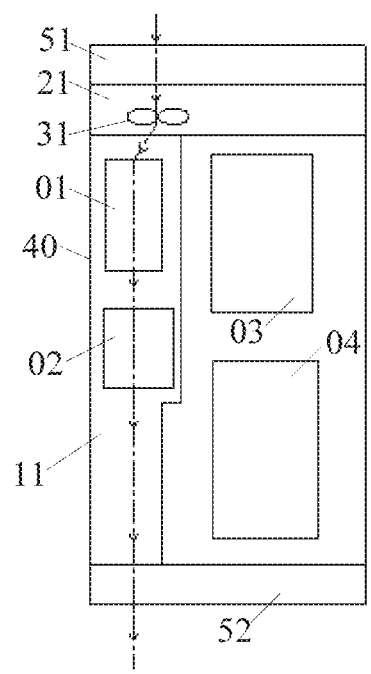
Figure 7F:
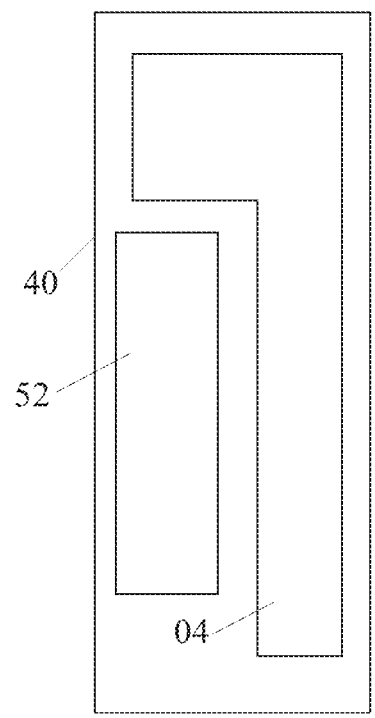

For example, as shown in FIG. 7e and FIG. 7f, the power unit 01 and the electric reactor 02 are arranged in sequence along the left side edge between the first side and the second side, and the switch 03 and the DC power distribution unit 04 are arranged in sequence along the along the right side edge between the first side and the second side.

The fourth arrangement mode for the relative positions between the devices is specifically as follows.

The power unit 01 and the DC power distribution unit 04 are close to one side edge between the first side and the second side; the electric reactor 02 is arranged in the center between two side edges and between the first side and the second side, and the switch 03 is close to the other side edge between the first side and the second side.

Figure 7G:
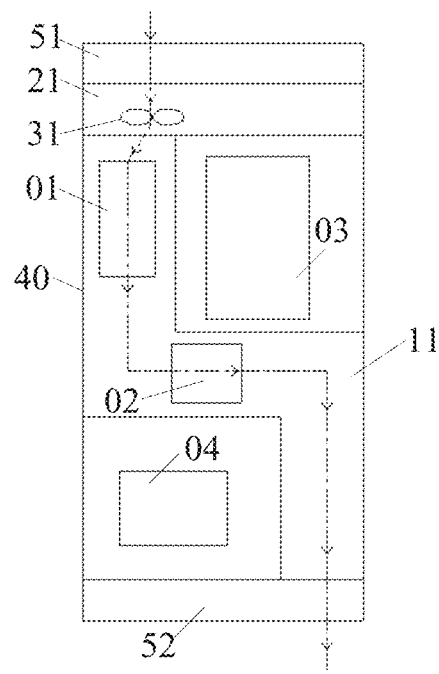
Figure 7H:
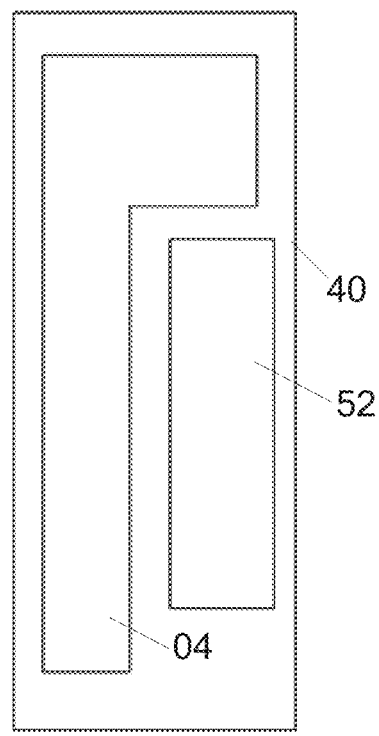

For example, as shown in FIG. 7g and FIG. 7h, the power unit 01 and the DC power distribution unit 04 are close to the left side edge between the first side and the second side, the electric reactor 02 is arranged in the center between the left side and the right side, and the switch 03 is close to the right side edge between the first side and the second side.

The above implementation modes are only four arrangement modes for the relative positions between the devices. In practical application, the arrangement mode includes the above four arrangement modes but not limited to those, and no specific limitation is made here. The arrangement mode can be determined according to the specific circumstances, all of which are within the protection scope of the present disclosure.

The above embodiments only describe the position relation of the devices inside the power cabinet. In practical application, the power cabinet is further required to be provided with the function of heat dissipation to ensure its normal operation. This embodiment provides an implementation mode of a power cabinet, and reference of specific structure of the power cabinet can be made to FIGS. 7a-7h. On the basis of the above embodiments, the power cabinet further includes a main heat-dissipation channel and a secondary heat-dissipation channel.

The main heat-dissipation channel is configured to dissipate heat for corresponding devices in a first chamber in the cabinet body 40, and the secondary heat-dissipation channel is configured to dissipate heat for corresponding devices in a second chamber in the cabinet body 40.

Preferably, a device with the heat dissipating capacity exceeding a heating threshold is arranged in the first chamber inside the cabinet body 40, and a device with a protection requirement level exceeding a preset protection level is arranged in the second chamber inside the cabinet body 40.

Specifically, the power unit 01 and the electric reactor 02 are arranged in the first chamber, and the switch 03 is arranged in the second chamber. In a case that the DC power distribution unit 04 and the control unit 05 are included, the DC power distribution unit 04 and the control unit 05 are both arranged in the second chamber.

Optionally, the main heat-dissipation channel is a direct air-cooled heat-dissipation channel in order to improve the heat-dissipation efficiency of the first chamber, and the secondary heat-dissipation channel is a direct air-cooled heat-dissipation channel or a heat exchanging air-cooled heat-dissipation channel, which is not specifically limited hereto, and all of those will fall within the protection scope of the present disclosure.

It should be noted that the primary heat-dissipation channel is preferably a direct air-cooled heat-dissipation channel, and the secondary heat-dissipation channel is preferably a heat exchanging air-cooled heat-dissipation channel, so that a compromise between the overall cost and the system reliability is obtained, that is, the overall cost of the power cabinet is reduced in the premise of ensuring the system reliability.

Another embodiment of the present disclosure provides several implementation modes of the main heat-dissipation channel, reference of which can be made to FIGS. 7a to 7h.

In a case that the power unit 01 and the electric reactor 02 are arranged on the same side edge between the first side and the second side, one implementation mode of the main heat-dissipation channel is specifically as follows: the main heat-dissipation channel is an integrated straight-through type heat-dissipation channel, that is, the main heat-dissipation channel includes a first sub heat-dissipation channel 11, where the first sub heat-dissipation channel 11 is configured to dissipate heat for the power unit 01 and the electric reactor 02, and the power unit 01 and the electric reactor 02 are arranged in sequence in the first sub heat-dissipation channel 11 along a heat-dissipation direction, as shown in FIG. 7e.

In a case that the power unit 01 and the electric reactor 02 are arranged on different side edges between the first side and the second side, the main heat-dissipation channel includes the first sub-heat-dissipation channel 11 and a second sub-heat-dissipation channel 12. The first sub-heat-dissipation channel 11 is configured to dissipate heat for the power unit 01 and the second sub-heat-dissipation channel 12 is configured to dissipate heat for the electric reactor 02. An inlet of the first sub-heat-dissipation channel 11 and an inlet of the second sub-heat-dissipation channel 12 are separately arranged, as shown in FIG. 7c.

Preferably, as shown in FIGS. 5a and 5b, the second sub-heat-dissipation channel 12 is located below the switch 03, that is, an inlet 300 of the second sub-heat-dissipation channel 12 is arranged under the switch 03 to save the internal space of the cabinet body 40, so that the internal space of the cabinet body 40 is further effectively utilized, thereby further reducing the overall cost of the power cabinet.

Optionally, in a case that the first sub-heat-dissipation channel 11 and the second sub-heat-dissipation channel 12 are in communication with each other, the first sub-heat-dissipation channel 11 and the second sub-heat-dissipation channel 12 share one single outlet, as shown in FIG. 7a. In a case that the first sub-heat-dissipation channel 11 and the second sub-heat-dissipation channel 12 are separated from each other, an outlet of the first sub-heat-dissipation channel 11 and an outlet of the second sub-heat-dissipation channel 12 are separately arranged, as shown in FIG. 7c. In practical application, the implementation modes includes the above implementation modes but not limited to those, which is not specifically limited hereto, and is determined according to the specific circumstances, all of the implementation modes will fall within the protection scope of the present disclosure.

It should be noted that in a case that the power unit 01 and the electric reactor 02 are arranged on different side edges between the first side and the second side, an implementation mode that the first sub-heat-dissipation channel 11 and the second sub-heat-dissipation channel 12 share one single inlet is not excluded. Compared with the implementation mode that an inlet of the first sub-heat-dissipation channel 11 and an inlet of the second sub-heat-dissipation channel 12 are separately arranged, the implementation mode that the first sub-heat-dissipation channel 11 and the second sub-heat-dissipation channel 12 share one single inlet will reduce the heat-dissipation efficiency, which is not specifically limited hereto, and is determined according to the specific circumstances, all of the implementation modes will fall within the protection scope of the present disclosure.

In addition, in practical application, in a case that the main heat-dissipation channel includes only one first sub-heat-dissipation channel 11, the channel may also be divided into at least two interconnected sections, and these interconnected sections may be in a shape similar to zigzag. As shown in FIG. 7g, in this case, the power unit 01 and the electric reactor 02 are arranged in the corresponding sections, respectively, and the electric reactor 02 is arranged in the middle section, which can ensure the demand to a large air flow, and also avoid the mutual interference between two air channels 11 and 12 at the same time.

The description above is only four implementation modes to the main heat-dissipation channel. In practical application, the implementation mode includes the above four implementation modes but not limited to those, which are not specifically limited hereto, and can be determined according to the specific circumstances, all of the implementation modes will fall within the protection scope of the present disclosure.

Preferably, in a case that the main heat-dissipation channel is a direct air-cooled heat-dissipation channel, an air blower chamber is further provided at the inlet of the main heat-dissipation channel, where the air blower chamber includes at least one sub-air blower chamber. In a case that the main heat-dissipation channel includes at least two sub-heat-dissipation channels, each of sub-heat-dissipation channels corresponds to one sub-air blower chamber, and at least one air blower is arranged in each sub-air blower chamber. The number and type of air blowers are not limited, as long as they can dissipate heat from the devices in the corresponding sub-heat-dissipation channels, respectively. Moreover, positions of the air blowers are not limited to the interior of the sub-air blower chambers, and may also be arranged at any position in the corresponding sub-heat-dissipation channel, respectively, In addition, several air blowers may also be arranged in the same sub-heat-dissipation channel in series.

As shown in FIGS. 7a and 7c, a first sub-air blower chamber 21 is arranged at the inlet of the first sub-heat-dissipation channel 11, and a first air blower 31 is arranged in the first sub-air blower chamber 21. A second sub-air blower chamber 22 is arranged at the inlet of the second sub-air blower chamber 22, and a second air blower 32 is arranged in the second sub-air blower chamber 22.

As shown in FIGS. 7e and 7g, the first sub-air blower chamber 21 is arranged at the inlet of the first sub-heat-dissipation channel 11, and the first air blower 31 is arranged in the first sub-air blower chamber 21.

Preferably, in a case that the power unit 01 and the electric reactor 02 are arranged on different side edges between the second side and the first side, a partition plate may be provided between the first sub-air blower chamber 21 and the second sub-air blower chamber 22 to achieve complete isolation, or a gap, as a convection channel, may be appropriately provided between the first sub-air blower chamber 21 and the second sub-air blower chamber 22. In a case that the first sub-heat-dissipation channel 11 and the second sub-heat-dissipation channel 12 share the same outlet after being converged (as shown in FIG. 7a), when the airflow is converged together, the wind pressure is not much different, so that the performance of the main air channel and the air blowers can be maximized, which can be specially verified by experiments. If the first sub-heat-dissipation channel 11 and the second sub-heat-dissipation channel 12 each has a corresponding outlet (as shown in FIG. 7b), when one of the first air blower 31 and the second air blower 32 has insufficient air volume or insufficient air pressure so as to affect the heat-dissipation to the corresponding devices, the intermediate partition plate or gap can be removed to meet the heat-dissipation requirements to the corresponding devices. In addition, when the heat-dissipation to the corresponding devices meets the requirements, the first sub-air blower chamber 21 and the second sub-air blower chamber 22 can be merged into one single sub-air blower chamber, and the first air blower 31 and the second air blower 32 can be merged into one single air blower to achieve cost optimization.

Preferably, the air blower chamber is arranged outside the inlet of the main heat-dissipation channel, which can save the internal space of the cabinet body 40, thereby further reducing the overall cost of the power cabinet. In practical application, the arrangement of the air blower chamber includes the above implementation modes but not limited those, which are not specifically limited hereto, and can be determined according to the specific circumstances, and all of the implementation modes will fall within the protection scope of the present disclosure.

In a case that the main heat-dissipation channel is arranged in the horizontal direction, the first side and the second side of the cabinet body 40 are the front portion and the rear portion of the cabinet body 40, respectively. According to this embodiment, when the main heat-dissipation channel is arranged in the horizontal direction, an arrangement mode is specifically as follows:

The inlet of the main heat-dissipation channel is arranged at a front portion of the cabinet body 40 or a front portion of any side surface, and the outlet of the main heat-dissipation channel is arranged at a rear portion of the cabinet body 40 or a rear portion of any side surface; or, the inlet of the main heat-dissipation channel is arranged at the rear portion of the cabinet body 40 or the rear portion of any side surface, and the outlet of the main heat-dissipation channel is arranged at the front portion of the cabinet body 40 or the front portion of any side surface.

For example, as shown in FIGS. 7a and 7c, the main heat-dissipation channel is arranged in the horizontal direction, and the inlet of the main heat-dissipation channels is composed of the inlets of the first sub-heat-dissipation channel 11 and the second sub-heat-dissipation channel 12, which are separately arranged in the front portion of the cabinet body 40. However, in FIG. 7a, the first sub-heat-dissipation channel 11 and the second sub-heat-dissipation channel 12 share the same outlet as their own outlets, the outlet is arranged at the rear portion of the cabinet body 40. Specifically, as shown in FIG. 4b, an outlet 400 of the main heat-dissipation channel is arranged on a lower left side of the rear portion of the cabinet body 40. In FIG. 7c, the first sub-heat-dissipation channel 11 and the second sub-heat-dissipation channel 12 are separated from each other. The outlet of the first sub-heat-dissipation channel 11 and the outlet of the second sub-heat-dissipation channel 12 constitute their own outlets, which are arranged at the rear portion of the cabinet body 40.

For another example, as shown in FIGS. 7e and 7g, the main heat-dissipation channel is arranged in the horizontal direction, the inlet and outlet of the first sub-heat-dissipation channel 11 are served as its own inlet and outlet, respectively, which are arranged in the front portion and rear portion of the cabinet body 40, respectively.

It should be noted that in a case that the inlet of the main heat-dissipation channel is composed of inlets of multiple sub-heat-dissipation channels, the inlet of the main heat-dissipation channel may also be separately arranged on at least two side surfaces. In a case that the outlet 400 of the main heat-dissipation channel is composed of the outlets of multiple sub-heat-dissipation channels, the outlet 400 of the main heat-dissipation channel may also be separately arranged on at least two side surfaces, which is not specifically limited hereto and may be determined according to the specific circumstances, all of the implementation modes will fall within the protection scope of the present disclosure.

It should be noted that both an outlet and an inlet should not be arranged on the same side of the cabinet body 40 so as to avoid the occurrence of unorganized airflow. In addition, if it is necessary to arrange both the outlet and inlet on the same side of the cabinet body 40, it is required to ensure that a distance between the inlet and the outlet can meet the heat-dissipation requirements for the main heat-dissipation channel and the secondary heat-dissipation channel.

The above arrangement is only the arrangement mode in a case that the main heat-dissipation channel is arranged in the horizontal direction. In practical application, the main heat-dissipation channel may also be arranged in the vertical direction, and the arrangement of the main heat-dissipation channel being arranged in the vertical direction is similar to the above arrangement, which can be deduced from the above description and will not be repeated here. The two arrangements are not limited hereto and may be determined according to the specific circumstances, and both of which will fall within the protection scope of the present disclosure.

An implementation mode of the main heat-dissipation channel is provided according to another embodiment of the present disclosure. Referring to FIGS. 7a, 7c, 7e, and 7g, on the basis of the above embodiments, the power cabinet further includes a protection structure.

The protection structures are arranged both outside the inlet and outlet of the main heat-dissipation channel and the secondary heat-dissipation channel to ensure the protection for the main heat-dissipation channel and the air blower to be with a certain level.

It should be noted that, in practical application, a circumstance with no protection structure is not excluded. The implementation mode is not specifically limited hereto, and may be determined according to specific circumstances, and all of which will fall within the protection scope of the present disclosure.

In a case that the main heat-dissipation channel adopts the above arrangement, that is, in a case that the inlets of the main heat-dissipation channel are arranged on the same side of the cabinet body 40, the protection structure is arranged outside the inlets of the main heat-dissipation channel.

In a case that the inlets of the main heat-dissipation channel are arranged on at least two side surfaces of the cabinet body 40, the protection structure is arranged in the main heat-dissipation channel outside the inlet of each sub-heat-dissipation channel.

It should be noted that in a case that the main heat-dissipation channel includes a sub-air blower chamber, the protection structure is arranged outside the sub-air blower chamber.

It should be noted that when the protection structure is arranged at the inlet, it is referred to as an air inlet structure, and when the protection structure is arranged at the outlet, it is referred to as an air outlet structure.

For example, as shown in FIGS. 7a and 7c, an air inlet structure 51 of the power cabinet is arranged at its own inlet and outside the first sub-air blower chamber 21 and the second sub-air blower chamber 22, and an air outlet structure 52 of the power cabinet is arranged at its own outlet.

For another example, as shown in FIGS. 7e and 7g, the air inlet structure 51 of the power cabinet is arranged at its own inlet and outside the first sub-air blower chamber 21, and the air outlet structure 52 of the power cabinet is arranged at its own outlet.

In an embodiment, the protection structure may be embodied as a waterproof louver structure, or a dustproof wire-mesh structure, or a waterproof louver structure and a dustproof wire-mesh structure. In practical application, the implementation mode is not specifically limited hereto, and may be determined according to specific circumstances, and all of which will fall within the protection scope of the present disclosure. In addition, in practical application, the dustproof wire-mesh structure may be replaced by a dustproof cotton structure. The implementation mode is not specifically limited hereto, and may be determined according to specific circumstances, and all of which will fall within the protection scope of the present disclosure.

It should be noted that, taking FIG. 7a as an example, and as shown in FIGS. 6a and 6b, a front cabinet door 600 can be arranged at the front portion of the cabinet body 40, and a back cabinet door 700 can be arranged at the rear portion of the cabinet body 40. In that case, the first sub-air blower chamber 21, the second sub-air blower chamber 22, and the air inlet structure 51 can all be arranged on the front cabinet door 600, and the air outlet structure 52 can be arranged on the back cabinet door 700 to save the internal space of the cabinet body 40 and reduce the overall cost of the power cabinet. In addition, it not only ensures the reliable protection to the entire cabinet body 40, but also facilitates maintenance. This implementation mode can also be implemented in other embodiments, which will not be described herein.

Figure 9:
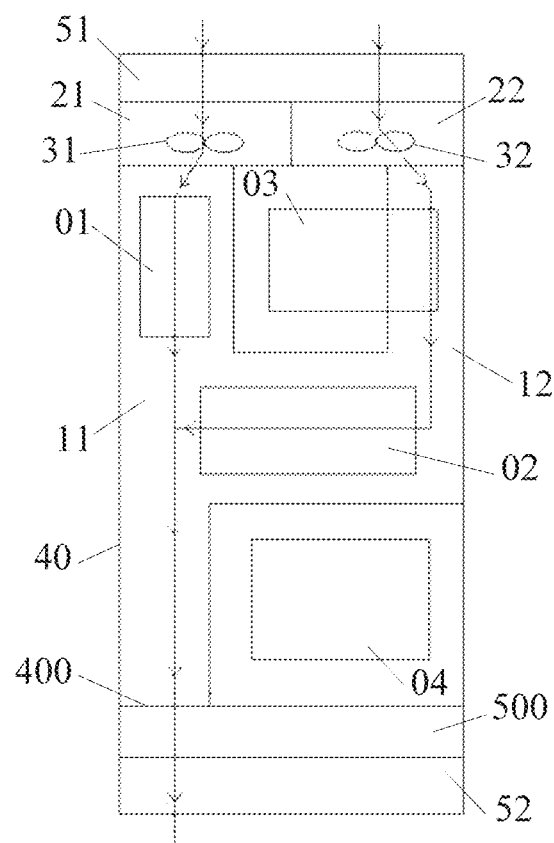

It should be noted that, as shown in FIG. 9, an air outlet chamber 500 may further be arranged at the outlet 400 of the main heat-dissipation channel, which is not specifically limited hereto. Whether the air outlet chamber 500 is arranged at the outlet 400 of the main heat-dissipation channel or not can be determined according to the specific circumstances, the implementation mode is not specifically limited hereto, and all of which will fall within the protection scope of the present disclosure.

An implementation mode in which the secondary heat-dissipation channel is a heat exchange air-cooled heat-dissipation channel is provided according to another embodiment of the present disclosure. The specific structure of the heat exchange air-cooled heat-dissipation channel can be referred to FIGS. 8*a* and 8*b*, and specifically includes a heat exchanger 110, an external circulation air duct inlet 133, and an external circulation air duct outlet 134.

The heat exchanger 110 is arranged on one side of the cabinet body 40 and includes an external circulation air blower 111 and an internal circulation air blower 112. Both the external circulation air duct inlet 133 and the external circulation air duct outlet 134 are in communication with an external air duct 130 provided by the external circulation air blower 111. The switch 03 is arranged in an internal circulation air duct 120 provided by the internal circulation air blower 112. In a case that the power cabinet includes the DC power distribution unit 04 and the control unit 05 (not shown in FIG. 8*a* and FIG. 8*b*), the DC power distribution unit 04 and the control unit 05 are also arranged in the internal circulation air duct 120 provided by the internal circulation air blower 112.

Figure 8A:
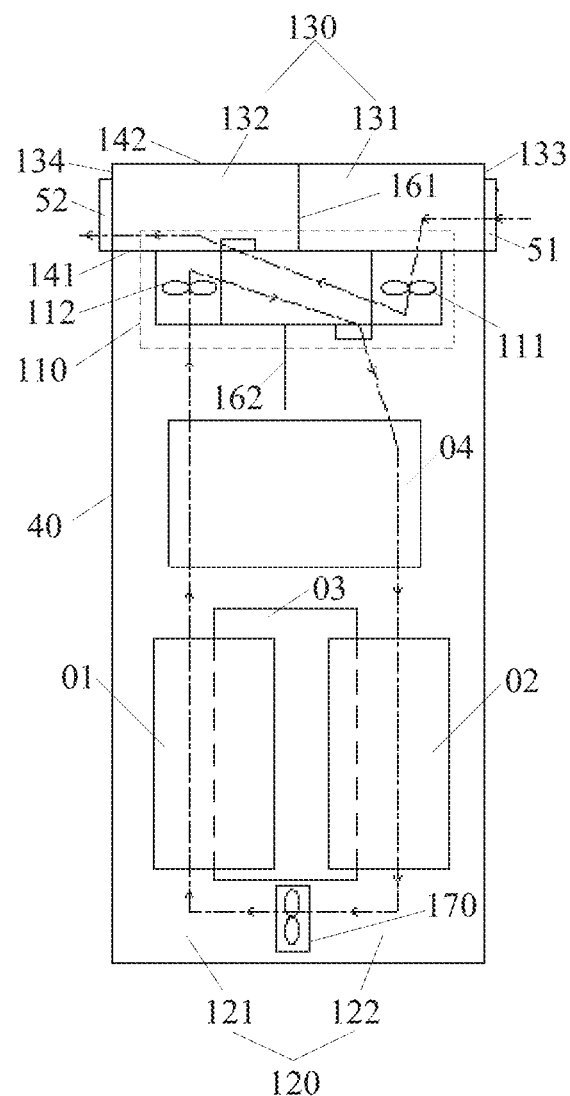
FIGS. 8a and 8b are two schematic structural views of a secondary heat-dissipation air duct, respectively.
Figure 8B:
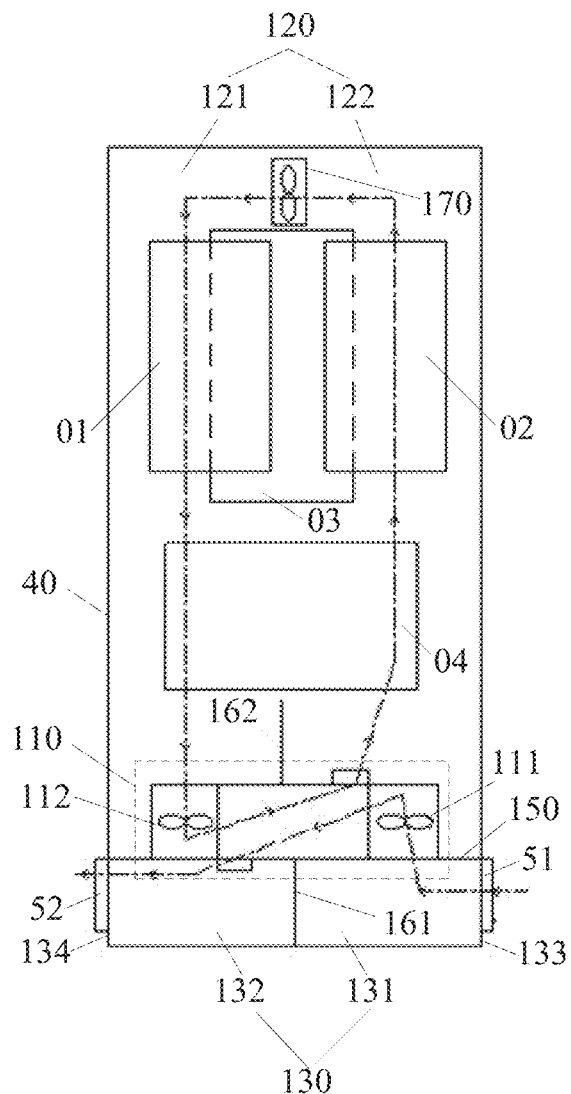

For example, referring to FIGS. 8*a* and 8*b*, when the secondary heat-dissipation air duct shown in FIGS. 8*a* and 8*b* operates normally, external air enters the heat exchanger 110 through the external circulation air duct 130 by the external circulation air blower 111, and exchanges heat with internal air entering the internal circulation air duct 120 in the heat exchanger 110 to perform heat exchanging, and the heat is dissipated to the external circulation air duct 130 via the heat exchanger 110, and then the temperature of the external air in the external circulation air duct 130 is increasing.

In the internal circulation air duct 120 of the heat exchanger 110, driven by the internal circulation air blower 112, internal air inside the internal circulation air duct 120 is blown into the heat exchanger 110, and exchanges heat with external air inside the external circulation air duct 130 by the heat exchanger 110, so that the temperature of internal air inside the internal circulation air duct 120 is reduced.

Optionally, the heat exchanger 110 may be arranged on the top of the cabinet body 40 (as shown in FIG. 8*a*) or at the bottom of the cabinet body 40 (as shown in FIG. 8*b*). In practical application, the above two implementation modes can be included but not limited to, which are not limited hereto and may be determined according to specific circumstances, and all of which will fall within the protection scope of the present disclosure. Preferably, the heat exchanger 110 is arranged on the top of the cabinet body 40, this is because it results in the structure of the heat exchanger 110 more compact while the protection to the DC power distribution unit 04, the switch 03 and the control unit 05 can be in a high level.

Accordingly, in a case that the heat exchanger 110 is arranged on the top of the cabinet body 40, as shown in FIG. 8*a*, the external circulation air duct 130 is a chamber located between an inner top 141 and an outer top 142 of the cabinet body 40. In a case that the heat exchanger 110 is arranged at the bottom of the cabinet body 40, as shown in FIG. 8*b*, the external circulation air duct 130 is a compartment arranged at the bottom of the cabinet body 40.

It should be noted that when there is no unorganized wind at the external circulation air duct inlet 133 and the external circulation air duct outlet 134, the external circulation air duct 130 may have an open structure Specifically, the external circulation air duct 130 may be provided with an external circulation air duct baffle 161, which divides the external circulation air duct 130 into an external circulation air inlet chamber 131 in communication with the external circulation air duct inlet 133, and an external circulation air outlet chamber 132 in communication with the external circulation air duct outlet 134. The internal circulation air duct 120 may also be provided with an internal circulation air duct baffle 162, which divides the internal circulation air duct 120 into an internal circulation air inlet chamber 122 in communication with the inlet of the internal circulation air duct 120, and an internal circulation air outlet chamber 121 in communication with the outlet of the internal circulation air duct 120.

Optionally, the internal circulation air duct 120 may be provided with or without at least one circulation turbulence device 170. The implementation mode is not specifically limited hereto and may be determined according the degree of disturbance in the internal circulation air duct 120, all of which will fall within the protection scope of the present disclosure. Moreover, the number of the circulation turbulence devices 170 may also be determined according to the degree of disturbance in the internal circulation air duct 120.

The position of the circulation turbulence device 170 is also not limited, which may be at any positions, and is not limited to the distal end of the internal circulation air duct as shown in FIGS. 8*a* and 8*b*, that is, an end away from the heat exchanger. With this arrangement, the degree of disturbance in the internal circulation air duct can be enhanced with a lower cost.

Optionally, the circulation turbulence device 170 may be embodied as an air blower. In practical application, this implementation mode can be included but not limited to, which is not limited hereto and may be determined according to specific circumstances, and all of which will fall within the protection scope of the present disclosure.

Optionally, the protection structures are arranged outside the external circulation air duct inlet 133 and the external circulation air duct outlet 134, respectively, so as to increase the service life of the external circulation air blower. Alternatively, an air blower with a lower protection level is adopted to reduce the overall cost. In practical application, it is not excluded the case without providing the protection structure. The implementation mode is not specifically limited hereto and may be determined according to the specific circumstances, and all of which will fall within the protection scope of the present disclosure.

Optionally, the protection structure may be embodied as a waterproof louver structure, a dustproof wire-mesh structure, or a waterproof louver structure and a dustproof wire-mesh structure. In practical application, the implementation mode is not specifically limited hereto, and may be determined according to specific circumstances, and all of which will fall within the protection scope of the present disclosure. In addition, in practical application, the dustproof wire-mesh structure may be replaced by a dustproof cotton structure. The implementation mode is not specifically limited hereto, and may be determined according to specific circumstances, and all of which will fall within the protection scope of the present disclosure.

It should be noted that, as shown in FIGS. 8*a* and 8*b*, in a case that the protection structure is arranged outside the external circulation air duct inlet 133, it is referred to as the air inlet structure 51. In a case that the protection structure is arranged outside the external circulation air duct outlet 134, it is referred to as the air outlet structure 52.

According to the above description of the disclosed embodiments, features described in the embodiments of the present application may be replaced or combined with each other, so that those skilled in the art may implement or practice the present application. The above description is merely preferred embodiments of the present application and does not limit the present application in any form. Preferred embodiments of the present application are disclosed above, and are not intended to limit the present application. Numerous alternations, modifications and equivalents can be made to the technical solutions of the present application by those skilled in the art in light of the methods and technical contents disclosed herein without departing from the scope of the present application. Therefore, any simple changes, equivalent variations and modifications on the above embodiments made according to the technical essence of the present application without departing the content of the technical solutions of the present application will fall within the protection scope of the technical solutions of the present application.

The invention claimed is:

1. A power cabinet, comprising a cabinet body and an electric reactor, a power unit and a switch arranged in an interior of the cabinet body; wherein
   the electric reactor is arranged in a lower space of the interior of the cabinet body between a first side of the cabinet body and a second side of the cabinet body, and the first side is opposite to the second side
   the power unit and the switch are arranged in the lower space of the interior of the cabinet body on the second side;
   the power unit, the electric reactor and the switch are electrically connected in sequence,
   wherein devices with a heat dissipating capacity exceeding a heating threshold, which include the power unit and the electric reactor, are arranged in a first chamber in the cabinet body, and
   devices with a protection requirement level exceeding a preset protection level, which include the switch, are arranged in a second chamber in the cabinet body,
   wherein a main heat-dissipation channel for dissipating a heat of the devices with the heat dissipating capacity exceeding the heating threshold is arranged in the first chamber in the interior of the cabinet body, and
   a secondary heat-dissipation channel for dissipating a heat of the devices with the protection requirement level exceeding the preset protection level is arranged in the second chamber, and
   wherein the main heat-dissipation channel is a direct air-cooled heat-dissipation channel and is arranged in a horizontal direction, and the secondary heat-dissipation channel is heat exchanging air-cooled heat-dissipation channel.

2. The power cabinet according to claim 1, further comprising: a DC power distribution unit, wherein the DC power distribution unit is arranged on the first side in the interior of the cabinet body; wherein
   the DC power distribution unit, the power unit, the electric reactor, and the switch are electrically connected in sequence;
   an input end of the DC power distribution unit is served as a DC port of the power cabinet and is led out from a lower portion of the first side; and
   an output end of the switch is served as an AC port of the power cabinet and is led out from a lower portion of the second side.

3. The power cabinet according to claim 2, further comprising: a control unit, wherein the control unit is arranged in an upper space of the interior of the cabinet body on the second side; and
   the control unit is electrically connected with each of the DC power distribution unit, the power unit, and the switch.

4. The power cabinet according to claim 3, wherein the DC power distribution unit is arranged in the second chamber; and
   the control unit is arranged in the second chamber.

5. The power cabinet according to claim 3, wherein the DC power distribution unit comprises a DC fuse component and a DC switch;
   a DC side of the power unit is connected to the DC fuse component via the DC switch;
   the DC switch is arranged in an upper space of the interior of the cabinet body on the first side; and
   the DC fuse component is arranged in the lower space of the interior of the cabinet body on the first side.

6. The power cabinet according to claim 3, wherein
   a center portion of the electric reactor is arranged at a middle between two side edges and arranged between the first side and the second side, a center portion of the power unit is arranged between one of the two side edges and the center portion of the electric reactor in a direction from the one of the two side edges to another side edge of the two side edges, and a center portion of the DC power distribution unit and a center portion of the switch are arranged between the center portion of the electric reactor and the another side edge of the two side edges in the direction from the one of the two side edges to the another side edge of the two side edges; or
   the center portion of the DC power distribution unit is arranged at the middle between the two side edges and arranged between the first side and the second side, the center portion of the power unit is arranged between the one of the two side edges and the center portion of the DC power distribution unit in the direction from the one of the two side edges to the another side edge of the two side edges, and the center portion of the electric reactor and the center portion of the switch are arranged between the center portion of the DC power distribution unit and the another side edge of the two side edges in the direction from the one of the two side edges to the another side edge of the two side edges.

7. The power cabinet according to claim 6, wherein the main heat-dissipation channel comprises a first sub-heat-dissipation channel and a second sub-heat-dissipation channel; wherein
   the first sub-heat-dissipation channel is configured to dissipate a heat of the power unit;
   the second sub-heat-dissipation channel is located below the switch and is configured to dissipate a heat of the electric reactor, the devices with the heat dissipation capacity exceeding the heating threshold include the heat of the power unit and the heat of the electric reactor; and an inlet of the first sub-heat-dissipation channel and an inlet of the second sub-heat-dissipation channel are separately arranged.

8. The power cabinet according to claim 7, wherein in a case that the first sub-heat-dissipation channel and the second sub-heat-dissipation channel are in communication with each other, the first sub-heat-dissipation channel and the second sub-heat-dissipation channel share one single outlet; or in a case that the first heat-dissipation sub-channel and the second heat-dissipation sub-channel are separated from each other, an outlet of the first heat-dissipation sub-channel and an outlet of the second heat-dissipation sub-channel are separately arranged.

9. The power cabinet according to claim 7, wherein the first side and the second side are a front portion of the cabinet body and a rear portion of the cabinet body, respectively; and an inlet of the main heat-dissipation channel is arranged at one of the front portion and the rear portion of the cabinet body, the inlet of the main heat-dissipation channel includes the inlet of the first sub-heat-dissipation channel and the inlet of the second sub-heat-dissipation channel, and an outlet of the main heat-dissipation channel is arranged at another of the front portion and the rear portion of the cabinet body.

10. The power cabinet according to claim 7, further comprising a control unit;

wherein the secondary heat-dissipation channel comprises a heat exchanger, an air inlet of an external circulation air duct, and an air outlet of the external circulation air duct; wherein the heat exchanger is arranged at a top or a bottom of the cabinet body and comprises an external circulation air blower and an internal circulation air blower;

the air inlet of the external circulation air duct and the air outlet of the external circulation air duct are both in communication with the external circulation air duct provided by the external circulation air blower; and the DC power distribution unit, the switch and the control unit are all located in an internal circulation air duct provided by the internal circulation air blower.

11. The power cabinet according to claim 7, further comprising protection structures, wherein the protection structures are arranged outside an inlet and an outlet of the main heat-dissipation channel and outside an inlet and an outlet of the secondary heat-dissipation channel, respectively, the inlet of the main heat-dissipation channel includes the inlet of the first sub-heat-dissipation channel and the inlet of the second sub-heat-dissipation channel, wherein the protection structures comprise a waterproof louver structure and/or a dustproof wire-mesh structure.

12. The power cabinet according to claim 2, wherein the power unit and the electric reactor are arranged in sequence along one of two side edges between the first side and the second side, and the switch and the DC power distribution unit are arranged in sequence along another side edge of the two side edges between the first side and the second side.

13. The power cabinet according to claim 2, wherein a center portion of the electric reactor is arranged at a middle between two side edges and arranged between the first side and the second side, wherein a center portion of the power unit and a center portion of the DC power distribution unit are arranged between one of the two side edges and the center portion of the electric reactor in a direction from the one of the two side edges to another side edge of the two side edges; and a center portion of the switch is arranged between the center portion of the electric reactor and the another side edge of the two side edges in the direction from the one of the two side edges to the another side edge of the two side edges.

14. The power cabinet according to claim 1, further comprising: a heat dissipator, wherein the power unit is arranged on the heat dissipator, and the heat dissipator is arranged in the lower space of the interior of the cabinet body on the second side and located in the first chamber with the power unit.

15. The power cabinet according to claim 1, wherein the main heat-dissipation channel is divided into at least two sections being mutually communicated, each of the devices with the heat dissipating capacity exceeding the heating threshold is arranged in a corresponding section of the at least two sections.

16. The power cabinet according to claim 1, wherein in a case that the main heat-dissipation channel is the direct air-cooled heat-dissipation channel, an air blower chamber is arranged at an inlet of the main heat-dissipation channel, and the air blower chamber comprises at least one sub-air blower chamber; or wherein in a case that the main heat-dissipation channel comprises at least two sub-heat-dissipation channels, each of the at least two sub-heat-dissipation channels corresponds to a corresponding one of the at least one sub-air blower chamber, and wherein a corresponding air blower is arranged in each of the at least one sub-air blower chamber.

* * * * *